United States Patent [19]
DeLaruelle et al.

[11] Patent Number: 6,075,828
[45] Date of Patent: Jun. 13, 2000

[54] RECEIVER DE-INTERLEAVING MEANS AND A METHOD FOR A REDUCED TIME DE-INTERLEAVING MEMORY

[75] Inventors: Antoine DeLaruelle, Leuven/Haasrode, Belgium; Franciscus A. M. Van De Laar, Eindhoven, Netherlands; Marco J. G. Bekooij, Eindhoven, Netherlands; Josephus A. Huisken, Eindhoven, Netherlands

[73] Assignee: U.S. Philips Corporation, New York, N.Y.

[21] Appl. No.: 08/961,966

[22] Filed: Oct. 31, 1997

[30] Foreign Application Priority Data

Nov. 11, 1996 [EP] European Pat. Off. .............. 96203144

[51] Int. Cl.⁷ ................................................ H03M 13/22
[52] U.S. Cl. .......................... 375/341; 711/157; 711/171; 714/795
[58] Field of Search ..................................... 375/262, 341; 711/157, 171; 714/795

[56] References Cited

U.S. PATENT DOCUMENTS

| | | | |
|---|---|---|---|
| 5,862,189 | 1/1999 | Huisken et al. | 375/341 |
| 5,898,698 | 4/1999 | Bross | 371/2.1 |

FOREIGN PATENT DOCUMENTS

| | | | |
|---|---|---|---|
| 0405673A1 | 1/1991 | European Pat. Off. | G11B 20/14 |
| WO9620536 | 7/1996 | WIPO | H03M 13/22 |

*Primary Examiner*—Amanda T. Le
*Attorney, Agent, or Firm*—Edward W. Goodman

[57] ABSTRACT

A DAB receiver in which a reduced time de-interleaving memory for storing metrics is used, but which still allows processing of DAB services which normally would exceed the storage capacity of the memory. This is achieved by varying the length of a stored metric, depending upon the storage capacity required, by varying the number of stored reliability bits in a metric. In this way, a trade-off can be made between storage capacity and processing quality.

4 Claims, 2 Drawing Sheets

6,075,828

RECEIVER DE-INTERLEAVING MEANS AND A METHOD FOR A REDUCED TIME DE-INTERLEAVING MEMORY

BACKGROUND OF THE INVENTION

1. Field of the Invention

The invention relates to a receiver for receiving an RF signal modulated with frames of time-interleaved data bits, said receiver comprising:

- means for retrieving the frames of time-interleaved data bits from the RF signal, and for generating metrics in response to retrieved data bits, a metric comprising a retrieved data bit and a number of reliability bits associated with each retrieved data bit and indicating the reliability of said data bit,
- de-interleaving means comprising metrics storage means for storing the metrics, a storage capacity of the storage means being smaller than a total number of metrics per frame.

The invention also relates to a de-interleaving arrangement for de-interleaving a digital signal arranged in frames, a frame comprising metrics, including a data bit and a number of reliability bits associated with each data bit indicating the reliability of said data bit, the de-interleaving arrangement comprising metrics storage means for storing the metrics, a storage capacity of the storage means being smaller than a total number of metrics per frame.

2. Description of the Related Art

The invention further relates to such a method. The receiver, the de-interleaving arrangement and the method according to the preamble are known from PCT International Application No. WO 96/20536, corresponding to U.S. patent application Ser. No. 08/576,544, filed Dec. 21, 1995. The known receiver comprises means for retrieving the data from the received RF signal, and adds to this, data reliability bits for indicating the reliability of the received data bits. The resulting bits are then de-interleaved, using storage memory means for temporarily storing these bits for de-interleaving purposes. A limited storage capacity is sufficient for de-interleaving a high quality audio application and sometimes a second application as well, as the data of such an audio application takes up only a part of the data capacity of a frame. Therefore a low-cost storage means (also called de-interleaving memory) is dimensioned such that only these applications can be processed. This effectively restricts the use of such a de-interleaving memory to applications not exceeding the available storage capacity of the de-interleaving memory. An application like digital video, using a major part of the total data capacity of a frame, can not be processed by the known receiver.

SUMMARY OF THE INVENTION

An object of the invention is to provide a receiver with a reduced de-interleaving capability which is still able to process applications requiring an excess amount of de-interleaving memory.

A receiver according to the invention is characterized in that the de-interleaving means is arranged for varying the metric storage capacity of the storage means depending upon the amount of data to be stored, by inversely varying the number of stored reliability bits per metric.

The invention is based on the recognition that by not storing part (or all) of the reliability bits in the de-interleaving memory and the processing following the de-interleaving, it is possible to re-configure the memory so that the part of the memory normally used by those reliability bits can be used for storing extra metrics. A consequence of reducing the number of stored reliability bits in the de-interleaving memory is that the processing following the time de-interleaving will be carried out with less accuracy or quality. By using the measure in accordance with the invention, one can process:

- either applications requiring a limited storage capacity at a high quality,
- or applications which occupy most or all of the data capacity, of a frame and consequently require a large storage capacity at a reduced quality.

In this way, it is possibly to exchange decoding quality for storage capacity.

An embodiment according to the invention is characterized in that the storage means is arranged in groups of memory locations, the memory locations within a group being accessible individually or together with at least one of the other locations in the group.

A group of memory locations is used for storing a full or complete metric, i.e., the data bit as well as all the reliability bits. This group of memory locations is normally addressed with one address. By using the measure in accordance with the invention, the individual memory locations within a group can be addressed individually for storing only the data bits without reliability bits resulting in a maximum storage capacity for reduced metrics, in pairs or triplets for storing data bits together with only one or two reliability bits, or as an entire group for storing the complete metric resulting in a minimum storage capacity for full-sized metrics. By switching between these addressing modes, it is possible to dynamically re-configure the storage capacity of metrics in accordance with the demand for storage capacity. This results in low-cost, but flexible and versatile receiver.

BRIEF DESCRIPTION OF THE DRAWINGS

The above object and features of the present invention will be more apparent from the following description of the preferred embodiments with reference to the drawings, wherein.

In the figures, identical parts are provided with the same reference numbers. In the flowcharts, a "Y" means that a condition in a block is met, and an "N" means that a condition in the block is not met.

DESCRIPTION OF THE PREFERRED EMBODIMENTS

The invention will be explained with the aid of the Digital Audio Broadcasting system (DAB) by way of example. A DAB signal comprises a convolutional encoded, interleaved digital datastream. The datastream is organized into frames and modulated on a carrier using an OFDM technique. Each frame in the datastream comprises a Synchronization Channel (SC), a Fast Information Channel (FIC) and a Main Service Channel (MSC). The data capacity available in the MSC is transmission-mode dependent. In mode II for example, the MSC is organized into 864 Capacity Units. A Capacity Unit is the smallest addressable information unit within a frame and comprises 64 data bits, divided into 4 groups of 16 bits each. The FIC provides information on the mapping of services transmitted in a frame on the Capacity Units within the frame, i.e., it indicates which Capacity Units in the frame are used for which service. For details on the DAB signal and the FIC reference is made to the DAB standard laid down in ETSI PRETS 300 401 Draft, June 1996.

Figure 1:
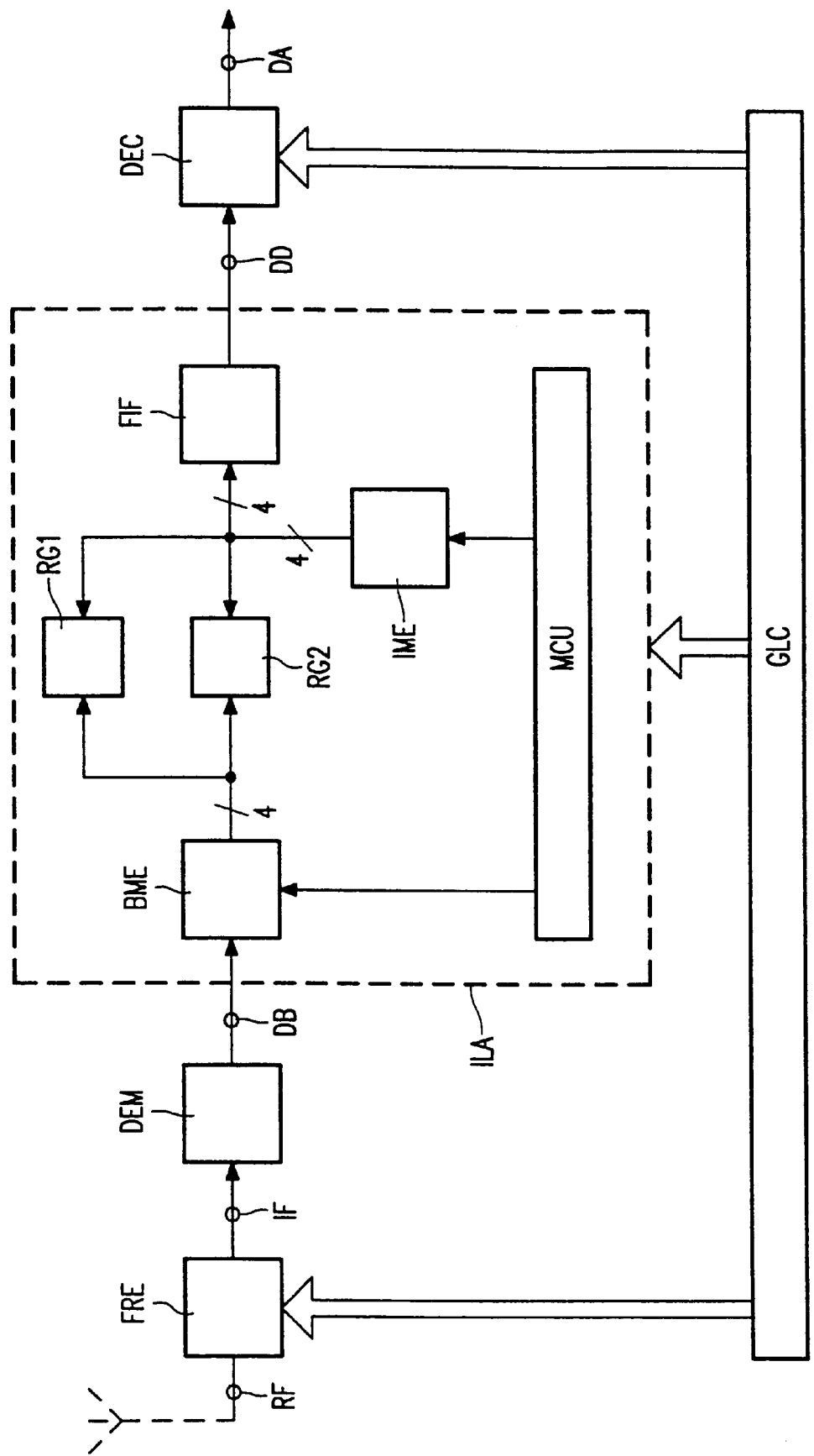
FIG. 1 shows a DAB receiver in which the de-interleaving method according to the invention is applied.

FIG. 1 shows a DAB receiver in which the de-interleaving method according to the invention is applied. In FIG. 1, a front-end FRE converts a received DAB modulated carrier RF into an intermediate frequency DAB signal IF from which a demodulation section DEM derives a DAB-demodulated signal DB. The DAB-demodulated signal DB comprises 4-bit samples which are referred to as metrics. Each metric comprises a data bit, representing a data bit of the interleaved convolutional encoded datastream, and three reliability bits indicating the reliability of the received data bit. In the DAB-demodulated signal DB, there are bursts of an integral number of Capacity Units at regular time-intervals.

In the interleaving arrangement ILA, a buffer memory BME stores metrics in the DAB-demodulated signal DB and stores these metrics in these bursts. The metrics are read from buffer memory BME and transferred to an interleaving memory IME (also called metrics storage means) under the control of a memory control unit MCU. The memory control unit MCU also controls the read-out of the metrics stored in the interleaving memory IME. This is in conformity with the de-interleaving scheme as shown in FIG. 1 of WO96/20356. The de-interleaved metrics are supplied to a First In First Out (FIFO) storage device FIF. This is done to spread the de-interleaved metrics read from the memory in a burst-like fashion more uniformly in time. However, the storage device FIF is not needed when it is not required to spread the de-interleaved metrics more uniformly in time. The de-interleaved DAB-demodulated signal DD is obtained from the FIFO storage device FIF. The interleaving arrangement ILA further comprises two data registers RG1 and RG2 which will not be further discussed in the specification. For more details on the interleaving arrangement ILA, reference is made to WO96/20356. In the de-interleaving scheme as described in WO96/20356, 480 bits are stored per row of the interleaving memory IME, each row relating to one Capacity Unit. In European Patent Application EP-A 405 673 corresponding to U.S. Pat. No. 5,276,827 an improved de-interleaving method is described, which allows a simple control of the interleaving memory. This interleaving method can also be used in the present invention. However, the interleaving is not the essence of the present invention.

Following de-interleaving, the de-interleaved DAB-demodulated signal DD is then supplied to a decoding section DEC, which outputs an error-corrected signal DA in response to the input signal DD. The decoding section DEC uses the reliability bits in the metrics in its error correction calculations for improving the decoding quality. Such a decoder can for example, be a soft-decision Viterbi-decoder.

The digital circuitry of the DAB receiver operates under the control of a global controller GLC. The global control GLC is used a.o., to retrieve the desired services (as ordered by a user) from the received DAB signal. For this purpose, the global controller GLC retrieves information from the FIC on that service and, using this information, instructs the MCU to selectively store only those Capacity Units in the interleaving memory IME which are relevant to the desired services. This means that the interleaving memory no longer needs to be able to store all Capacity Units within a frame, but only a selection thereof. For example, an interleaving memory capable of interleaving 216 Capacity Units per frame is sufficient for processing a high quality audio service occupying only 168 Capacity Units, leaving room for processing an additional data application of, say, 64 Capacity Units. A drawback of this is that only services can be processed which do not occupy more than 216 Capacity Units per frame. This restricts the flexibility of the receiver significantly and means that video services, which may use all 864 Capacity Units within a frame, can not be processed.

The invention provides a solution to this problem by varying the metric storage capacity of the storage means or interleaving memory IME depending upon the amount of data to be stored, by varying the number of stored reliability bits per metric. In the invention, it is recognized that a trade-off can be made between storage capacity and processing quality by storing more or less reliability bits per metric. This can be done as follows. The global controller GLC determines, on the basis of the user input and the information retrieved from the FIC, how many Capacity Units per frame need to be processed. If this number is lower than the available storage capacity, in this case 216 Capacity Units, there is of course, no capacity problem and no measures need be taken. If this number is larger than 216, but smaller than 432 Capacity Units, the interleaving memory is re-configured to store only two bits per metric, namely, the data bit together with the most significant reliability bit. Now a metric can be stored in only two bits instead of four, resulting in a doubling of the storage capacity as expressed in metrics. If the number is larger than 432 Capacity Units, the interleaving memory IME is re-configured to store only 1 bit per metric, namely, the data bit. This results in a metric storage capacity of four times the original metric storage capacity. This is achieved by reducing the length (i.e., number of bits) of a metric. When the global controller GLC determines that the required number of Capacity Units can be reduced, for example, due to the fact that a user is only interested in a reduced number of services requiring a limited storage capacity, the interleaving memory IME is re-configured accordingly. This can be done on a frame by frame basis. This means there is a trade-off between the number of Capacity Units which can be stored and the quality of the decoding, as a reduction of the number of reliability bits per metric will result in a loss of decoding quality. For example, in the case of a Viterbi decoding algorithm, the loss of the three reliability bits for the decoding will result in sensitivity loss of the receiver of several dB.

Figure 2:
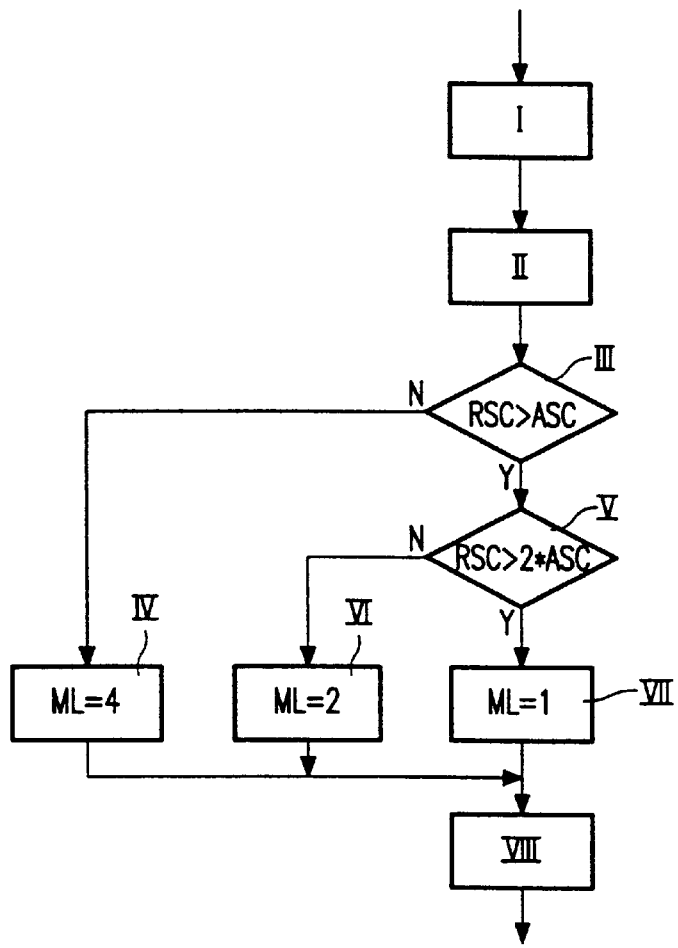
FIG. 2 shows a diagram of a flowchart of a method in accordance with the invention.

FIG. 2 shows a diagram of a flowchart of a method in accordance with the invention. This method can be implemented in the GLC and the MCU. At the start of the flowchart it is known which service needs to be processed. This is determined by a user and will not be discussed in detail. In this example, the available storage capacity ASC, expressed in Capacity Units, is set at 25% (=216 CUs) of the total number of Capacity Units per frame (=864 CUs). ASC is the number of CUs which can be stored, in which the metrics have their full length of 4 bits. In block, I the FIC is analyzed to retrieve the information on the mapping of CUs and services. From this information, the required storage capacity RSC (=number of CUs to be stored) is calculated in block II. In block III, this required storage capacity RSC is compared with the available storage capacity ASC. If the condition (RSC>ASC) is not true ("N") then there is sufficient storage capacity and the metric length ML of the stored metrics is set at its maximum value of 4 in block IV. If the condition of block III is true, it is determined, in block V, if RSC>2*ASC. If so, then ML is set at 1 in block VII to maximize the metric storage capacity. If RSC<2*ASC ML is set at 2 in block VI for an intermediate storage capacity and intermediate quality. The parameter ML is used by the MCU of FIG. 1 for addressing the interleaving memory IME during read and write operations. In fact, ML denotes the number of bits per metric to be read or written. In block VIII, the de-interleaving takes place, which comprises both read and write operations from and to the interleaving memory IME, as described in WO96/20536, however, as a function of parameter ML. However, a read operation from the interleaving memory IME differs in some aspects significantly from a write operation. In a write operation, the full 4-bit metric may be supplied to the four memory units and by addressing only the relevant memory locations only the relevant bits of the metric will be stored using parameter ML.

Figure 3:
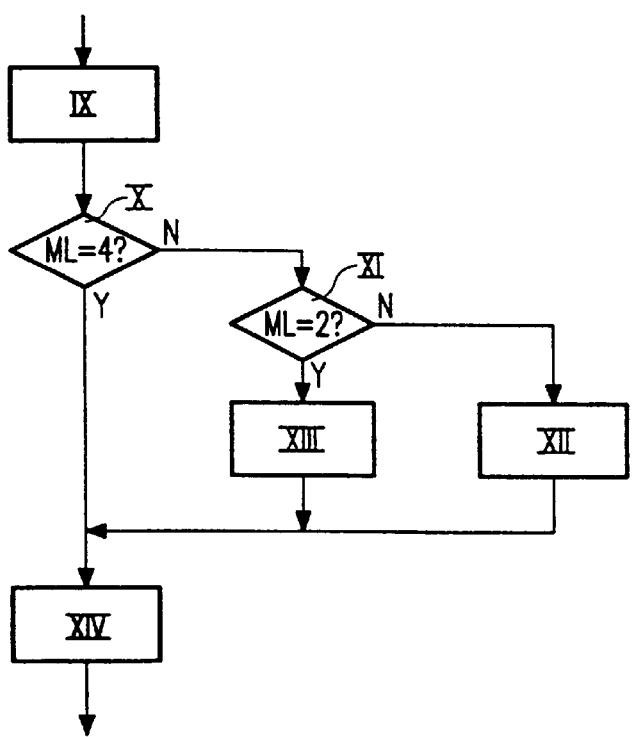
FIG. 3 shows a diagram of a flowchart for a read operation from an interleaving memory in accordance with the invention.

FIG. 3 shows a diagram of a flowchart for a read operation from an interleaving memory in accordance with the invention. This read operation is controlled by the MCU. In block IX, the ML bits are read from a memory location in the interleaving memory IME. If ML is smaller than 4, extra dummy bits need to be added to the ML bits in order to arrive at the normal metric length of 4 bits. These 4 bits are required for the further processing, as this processing normally relies on a metric length of 4 bits. Therefore, the value of ML is checked in blocks X, and XI. If ML=4 ("Y" in block X) no further action need be taken and the metric may outputted as is in block XIV. If ML=2 ("N" in block X and "Y" in block XI) then two bits are be added in block XIII at the least significant places of the metric. The value of these two bits is preferably the same as the value of the reliability bit accompanying the data bit. If ML=1 ("N" in block XI), then 3 bits are added to the data bit, the value of these bits preferably being equal to the value of the data bit. This normally indicates that the reliability of the data bit is the highest possible. For a soft-decision Viterbi decoder, this means that it actually operates as a hard-decision Viterbi decoder. Other ways of normalizing the length of the metrics to 4 bits are also possible.

The interleaving memory IME must now be arranged to be able to deal with different metric lengths and, consequently, with a variety of addressing capabilities. In the DAB example, the memory locations should be addressable individually for storage of only data bits (i.e., a 1-bit metric), in pairs for storing a data bit and the most significant reliability bit (i.e., a 2-bit metric), or in groups of four for storing a complete 4-bit metric, i.e., data bit plus 3 reliability bits. As known from WO96/20356, an interleaving memory can be arranged in four memory units of equally sized DRAM units. Memory locations in each memory unit are addressed by activating the proper row and column select lines. By simultaneously activating the same row and columns in each of the memory units, a four-bit metric can be written to or read from the interleaving memory IME. When the memory is re-configured to a metric length of 1 or 2 bits, the addressing can be done by simply activating the proper row and column select lines of only one memory unit in the case of a metric length of 1 bit, or by simply activating the proper row and column select lines of the two memory units in which the two bits are to be written in or read from. This flexible addressing of memory locations can be done in various ways. As described hereabove, it can be done by activating only the row and column select lines of the relevant memory units. If a memory unit has a memory unit select line for allowing the memory unit to be written to or read from only when the memory unit select line is active, the row and column lines can all be addressed simultaneously and the memory unit select lines can then be used to distinguish between memory locations of different memory units. Other ways for addressing the memory can be conceived as well without departing from the scope of the present invention.

While a limited number of embodiments are shown and described by way of example, a person skilled in the art may conceive many other alternative embodiments without departing from the spirit and the scope of the invention claimed.

The invention may also be used advantageously in receivers other than DAB, for example, in Digital Video Broadcast (DVB) receivers. It may be expected that a typical DVB receiver will equally comprise some form of de-interleaving.

It will also be clear that the interleaving memory may be an external RAM as well as an embedded RAM.

It will be evident that where the term select line is used in this specification, this term may alternatively be replaced by row or column.

An increase of the storage capacity from 4-bit metrics to 2- and 1-bit metrics can be done without penalty. A decrease of the storage capacity (i.e., an increase in metric length) may result in a temporary loss of the data as different applications may have been stored at locations in different memory banks. This loss of data can extend over 15 frames and results, in case of an audio application, in a temporary muting of the audio signal. However, with a proper memory management this loss of data can be avoided.

It will also be evident that the format of a metric is not restricted to 1 data bit and 3 reliability bits. The invention can also be used for metrics having a number of reliability bits differing from 3. Furthermore, a metric may also comprise more than one data bit. In each case, a reduction of the length of a stored metric is still possible by reducing the number of reliability bits to be stored.

We claim:

1. A receiver for receiving an RF signal modulated with frames of time-interleaved data bits, said receiver comprising:

means for retrieving the frames of time-interleaved data bits from the RF signal, and for generating metrics in response to retrieved data bits, a metric comprising a retrieved data bit and a number of reliability bits associated with each retrieved data bit indicating the reliability of said data bit; and de-interleaving means comprising metrics storage means for storing the metrics, a storage capacity of the storage means being smaller than a total number of metrics per frame, characterized in that the de-interleaving means is arranged for varying the metric storage capacity of the storage means, depending upon the amount of data to be stored, by inversely varying the number of stored reliability bits per metric.

2. The receiver of claim 1, characterized in that the storage means is arranged in groups of memory locations, the memory locations within a group being accessible individually or together with at least one of the other locations in the group.

3. A de-interleaving arrangement for de-interleaving a digital signal arranged in frames, a frame comprising metrics, including a data bit and a number of reliability bits associated with each data bit indicating the reliability of said data bit, the de-interleaving arrangement comprising metrics storage means for storing metrics, a storage capacity of the storage means being smaller than a total number of metrics per frame, characterized in that the de-interleaving arrangement is arranged for varying the metric storage capacity of the storage means, depending upon the amount of data to be stored, by inversely varying the number of stored reliability bits per metric.

4. A method for de-interleaving a digital signal arranged in frames, a frame comprising metrics, including a data bit and a number of reliability bits associated with each data bit indicating the reliability of said data bit, the method including the step of storing the metrics in a storage means, a storage capacity of the storage means being smaller than a total number of metrics per frame, characterized in that the method further comprises the step:

varying the metric storage capacity of the storage means, depending upon the amount of data to be stored, by inversely varying the number of stored reliability bits per metric.

* * * * *